United States Patent [19]

Sardella

[11] Patent Number: 5,856,707
[45] Date of Patent: Jan. 5, 1999

[54] VIAS AND CONTACT PLUGS WITH AN ASPECT RATIO LOWER THAN THE ASPECT RATIO OF THE STRUCTURE IN WHICH THEY ARE FORMED

[75] Inventor: John C. Sardella, Pilot Point, Tex.

[73] Assignee: STMicroelectronics, Inc., Carrollton, Tex.

[21] Appl. No.: 743,380

[22] Filed: Nov. 4, 1996

Related U.S. Application Data

[63] Continuation of Ser. No. 526,460, Sep. 11, 1995, abandoned.

[51] Int. Cl.$^6$ ................................................. H01L 23/48
[52] U.S. Cl. ........................ 257/758; 257/752; 257/763; 257/751
[58] Field of Search .................................. 257/750–752, 257/758–760, 763, 764, 765, 915

[56] References Cited

U.S. PATENT DOCUMENTS

| | | | |
|---|---|---|---|
| 4,541,169 | 9/1985 | Bartush | 257/758 |
| 4,775,550 | 10/1988 | Chu et al. | 427/38 |
| 4,826,786 | 5/1989 | Merenda et al. | 437/195 |
| 5,063,175 | 11/1991 | Broadbent | 437/192 |
| 5,069,749 | 12/1991 | Gutierrez | 427/99 |
| 5,079,188 | 1/1992 | Kawai | 437/195 |
| 5,202,579 | 4/1993 | Fujii et al. | 257/763 |
| 5,304,510 | 4/1994 | Suguro et al. | 437/195 |
| 5,354,712 | 10/1994 | Ho et al. | 437/195 |
| 5,437,763 | 8/1995 | Huang | 216/18 |
| 5,519,239 | 5/1996 | Chu | 257/314 |

FOREIGN PATENT DOCUMENTS

| | | | |
|---|---|---|---|
| 0430403 | 6/1991 | European Pat. Off. | 257/764 |
| 0116953 | 4/1992 | Japan | 257/751 |
| 0198525 | 8/1993 | Japan | 257/751 |

*Primary Examiner*—Tom Thomas
*Assistant Examiner*—Hung Kim Vu
*Attorney, Agent, or Firm*—Theodore E. Galanthay; Lisa K. Jorgenson; Peter J. Thoma

[57] ABSTRACT

A method of forming vias in an interlevel dielectric structure of an integrated circuit, such that the aspect ratio of the vias is smaller than the aspect ratios of vias having a height equal to the thickness of the entire interlevel dielectric structure, and the integrated circuit formed according to such a method. Conductive elements are formed over an insulator. A first dielectric structure is formed over the conductive elements and over the insulator. The first dielectric structure contains a first dielectric, formed over the conductive elements and the insulator, and a planarizing dielectric, formed over the first dielectric to bulk fill the areas between the conductors. A thin layer of a second dielectric can be formed over the first dielectric and the planarization dielectric. Vias are patterned and etched in the first dielectric structure. The thickness of the first dielectric structure is such that the aspect ratios of the vias through it is close to, or less than, 1. A thin barrier is formed in the vias, and the vias are filled with contact plugs. A second dielectric structure is then formed over the first dielectric structure and the contact plugs. Vias are patterned and etched in this second dielectric structure. The thickness of the second dielectric structure is also such that the aspect ratios of the vias through it is close to, or less than, 1. A thin barrier is formed in the vias, and the vias are filled with contact plugs. Additional dielectric structures containing vias and contact plugs may be formed over the second dielectric structure.

22 Claims, 9 Drawing Sheets

VIAS AND CONTACT PLUGS WITH AN ASPECT RATIO LOWER THAN THE ASPECT RATIO OF THE STRUCTURE IN WHICH THEY ARE FORMED

This is a Continuation of application Ser. No. 08/526,460, filed Sep. 11, 1995, now abandoned.

The present invention relates to the field of integrated circuits, and is more specifically directed to forming vias in integrated circuits.

BACKGROUND OF THE INVENTION

A continuing trend in the semiconductor industry is to decrease chip size while increasing the density of components per unit area. This has lead to a decrease in the linewidth of both conductors and the spaces between the conductors, making it advantageous to use several layers of conductors, typically formed of metal for the uppermost conductor levels, in the integrated circuit device. Because of the increase in the number of metallization layers it has become important that the interlevel dielectric structures that serve as insulators between adjacent metallization layers are as planar as possible. To produce planar interlevel dielectric structures the thickness of the interlevel dielectric structures must be increased. Additionally, increases in the thickness of the interlevel dielectric structures also reduce the interlevel capacitance, which has a positive effect on the speed of the circuit. However, the increase in the thickness of the interlevel dielectric structures poses problems for via etch and plug formation.

FIG. 1, is a cross-sectional view of conventionally formed vias 22, 24, and plugs 28, 30, with thin barriers 26, 27 on the sidewalls and bottoms of the vias, formed in a thick interlevel dielectric structure 32. The interlevel dielectric structure 32 is made up of a first dielectric layer 46 deposited over conductive elements 12, 14 and an insulation layer 44; a planarizing layer 48; and a thick second dielectric 20.

As the thickness of the interlevel dielectric structure increases or the device size decreases the aspect ratios of the vias formed in the interlevel dielectric structure increases. Referring to FIG. 1, the aspect ratios of vias 22, 24 is the ratio of the height of the vias to the widths of the vias. The vias 22, 24 have to allow contact plugs 28, 30 and barrier layers 26, 27 to make contact between the conductive elements 12, 14 of the metallization layer below and the enclosures 34, 36 above the interlevel dielectric structure 32, so the vias must extend through the entire interlevel dielectric structure 32. For vias etched through the entire interlevel dielectric structure, the heights of the vias 34, 36 is the thickness of the interlevel dielectric structure 32. Therefore, as the thickness of the interlevel dielectric structure increases, the heights of the vias increase, causing an increase in the aspect ratios of the vias. Additionally, the widths of the vias 22, 24 cannot exceed the widths of the conductive elements 12, 14 over which the vias are formed. Therefore, as the device size decreases, causing the widths of the conductive elements to decrease, the widths of the vias 22, 24 must decrease, and again the aspect ratios of the vias 22, 24 increase.

As the aspect ratios of the vias 22, 24 increase, the ease of etching these vias decrease, particularly as the aspect ratios increase significantly above 1. In vias 22, 24 with high aspect ratios, it is difficult to get a vertical etch, resulting in slanted sidewalls. The slanted sidewalls of the vias 22, 24 cause problems with producing uniform barriers 26, 27 in the vias 22, 24. The slanted sidewalls also make the tops of the vias 22, 24 larger than the bottoms of the vias. To compensate for this, either the width of the top of the vias 22, 24 will be larger than the width of the conductive elements 12, 14 below the vias and the enclosures 34, 36 above the via, or the size of the entire vias 22, 24 must be reduced.

In vias, like via 24, where the width of the top of a via 24 is larger than the enclosure 36 above the via the contact plug 30 and barrier 27 will not be entirely covered by the enclosure 36, part of the barrier 27 may be etched away in later process steps, reducing the reliability of the device. Additionally, larger tops of vias increase the misalignment sensitivity of the enclosures, even if the enclosure is larger than the top of the via, as in the case of enclosure 34 and via 22. Although the enclosure 34 is large enough to cover the entire top of the via 22, any misalignment of the enclosure 34 will result in the barrier 26 and plug 28 not being entirely covered by the top of the via, producing the problems discussed above. If one were to enlarge the enclosures 34, 36 to ensure that they cover the vias 22, 24 entirely, a short circuit may result because of the small distance between conductors.

Furthermore, the widths of the contact plugs 28, 30 at the tops of the vias will also be large. Contact plugs are usually either tungsten or aluminum. Tungsten is typically the metal used to fill vias with high aspect ratio since tungsten has better flow properties than aluminum. Contact plugs 28, 30 are typically formed by depositing tungsten and etching it back to leave tungsten only in the vias. However, because of the widths of the tops of the vias 22, 24 the tungsten does not etch evenly and gaps 23a, 23b, 25a, 25b are formed at the tops of the vias, which reduce the performance and reliability of the device. The thickness of the tungsten in the vias can also cause cracks 19 in the tungsten.

The smaller bottoms of vias 22, 24 also make it more difficult for the metal of the plug to fill the vias, resulting in poor step coverage. For larger sized vias, like via 24, this can cause gaps at the bottom of the via which lead to reduced performance and reliability of the device. For vias, like via 22, where the entire size of the via is reduced, the poor step coverage can result in a void 21 the width of the bottom the via, which produces an open circuit.

It is therefore an object of this invention to provide a method of forming vias with low aspect ratios in thick interlevel dielectric structures.

It is further an object of this invention to provide a method of forming vias with aspect ratios of about 1 or below in thick interlevel dielectric structures.

It is further an object of this invention to provide a method of forming vias such that the enclosure sensitivity of the conductors above the vias is reduced.

It is further an object of this invention to provide a method of forming vias with straight sidewalls.

It is further an object of this invention to provide a method of forming contact plugs with good step coverage.

It is further an object of this invention to provide such a method that utilizes conventional process flows.

It is further an object of the present invention to provide integrated circuit formed according to such a method.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor structure formed according to such a method, in which vias with smaller aspect ratios than that of vias formed through an entire interlevel dielectric structure are formed in the interlevel dielectric structure. Conductive elements are formed over an insulator. A first dielectric structure is formed over the conductive elements and over the insulator. The first dielectric structure contains a first dielectric, formed over the conductive elements and the insulator, and a planarizing dielectric, formed over the first dielectric to bulk fill the areas between the conductors. A thin layer of a second dielectric can be formed over the first dielectric and the planarizing dielectric. Vias are patterned and etched in the first dielectric structure. A thin barrier is formed in the vias, and the vias are filled with contact plugs. A second dielectric structure is then formed over the first dielectric structure and the contact plugs, in which vias are patterned and etched. A thin barrier is formed in the vias, and the vias are filled with contact plugs. Additional dielectric structures containing vias and contact plugs may be formed over the second dielectric structure.

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
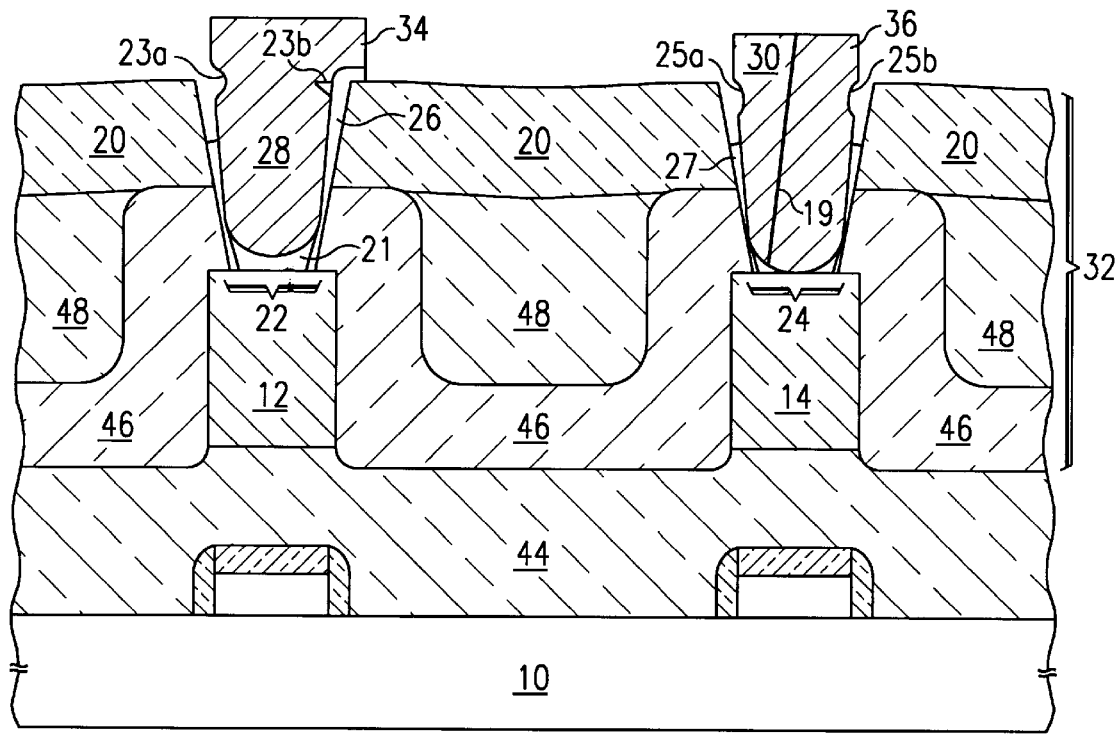
FIG. 1 is a cross-sectional view of conventionally formed vias in a thick interlevel dielectric structure.
Figure 2:
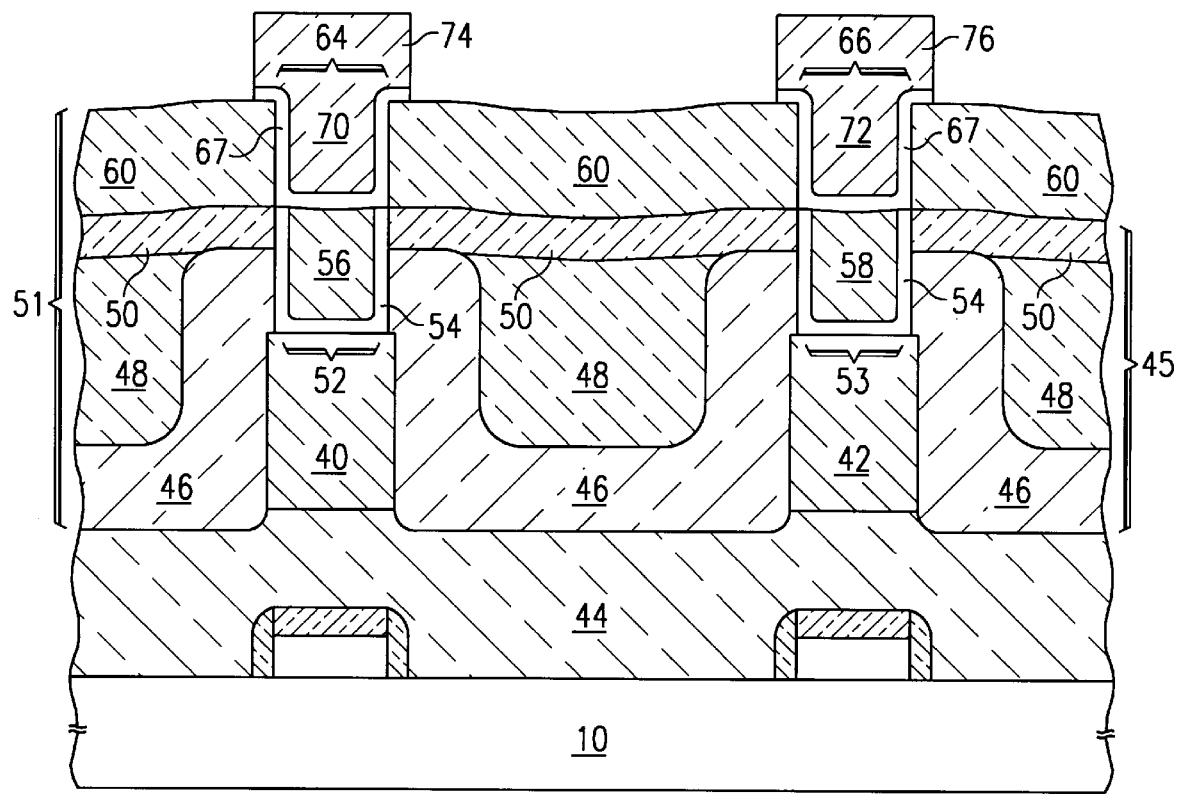
FIG. 2 is a cross-sectional view of an integrated circuit formed according to the preferred embodiment of the present invention.

Referring to FIG. 2 the physical construction of an integrated circuit formed according to the preferred embodiment of the current invention will now be described in detail. An insulation layer 44 overlies substrate 10, and transistors formed thereon, the details of which are not important to the present invention. Insulation layer 44 can be borophospho silicate glass (BPSG), phosphorous silicate glass (PSG), or another doped or undoped silicon oxide. Conductive elements 40, 42 overly the insulation layer 44. The conductive elements are typically between 0.65 $\mu$m and 1.2 $\mu$m thick. The conductive elements can be aluminum, tungsten, or any other conductor or combination thereof used for forming conductive elements.

A first dielectric structure 45 overlies the conductive elements 40, 42 and the insulation layer 44. The first dielectric structure 45 contains a layer of first dielectric 46 of conformal undoped oxide, or any other oxide known in the art, a layer of planarizing dielectric 48, typically spin-on-glass (SOG), and a thin layer of second dielectric 50 of conformal undoped oxide, or any other oxide known in the art. The layer of first dielectric 46 over lies the conductive elements 40 and 42 and the insulation layer 14. The layer of planarizing dielectric 48 bulk fills the areas between the conductive elements to achieve better planarization.

Figure 3:
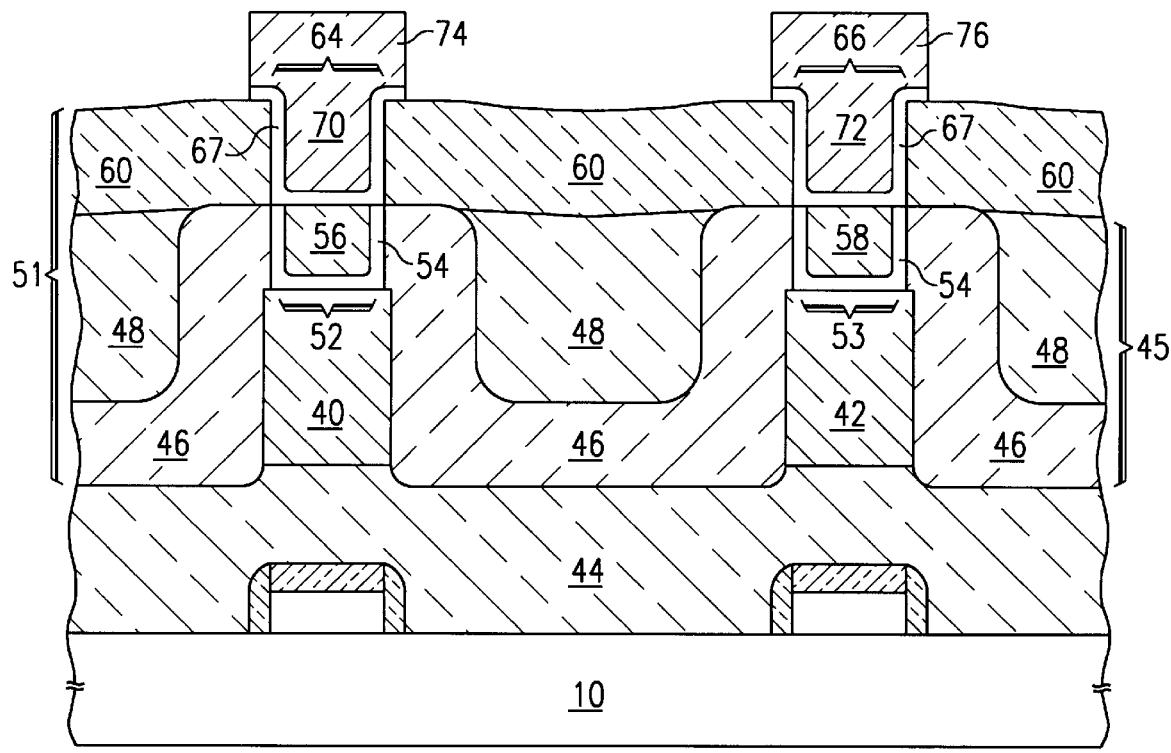
FIG. 3 is a cross-sectional view of an alternative preferred embodiment of the integrated circuit formed according to the present invention.

The second dielectric 50 is not necessary in all applications. As shown in FIG. 3, the first dielectric structure 45 can contain just a layer of first dielectric 46 overlying the conductive elements 40, 42 and the insulator layer 44, as described above, and a layer planarizing dielectric 48 overlying the first dielectric 46, as described above. The second dielectric 50 produces a thicker first dielectric structure 45, and therefore a thicker overall interlevel dielectric structure 51. However, the aspect ratios of vias 52, 53 in the first dielectric structure of is lower in first dielectric structures without the second dielectric 50.

The thickness of the first dielectric structure 45 is based on the aspect ratios of the vias 52, 53 through the first dielectric structure 45. The aspect ratios of the vias 52, 53 are the ratios of the thickness of the first dielectric structure 45 to the width of the vias. The aspect ratios of the vias 52, 53 should be approximately at or a below selected threshold. This threshold is based on the ease of etching vias 52, 53 having straight sidewalls, the ease of filling the vias while retaining good step coverage, and the goal of increasing the thickness of the entire interlevel dielectric structure 51. For example, for conductive elements 0.65 $\mu$m thick, and a threshold via aspect ratio of 1, the thickness of the first dielectric structure 45 over the conductive elements 40, 42 is preferably about, or below, 7000 Å. The thickness of the first dielectric structure 45 when it contains both the first 46 and the second 50 dielectrics is the combined thickness of the first 46 and second 50 dielectrics (as in FIG. 2), and just the thickness of the first dielectric 46 when the first dielectric structure 45 does not contain the second dielectric 50 (as in FIG. 3).

A thin first barrier 54 overlies the portions of conductive elements 40, 42 exposed in the vias 52, 53, and the sidewalls of the vias 52, 53. The first barrier is preferably titanium, titanium nitride, titanium tungsten, or a combination thereof. The first barrier is usually the minimum thickness required to achieve a uniform barrier in the via. In modern process technology, a barrier in a via having an aspect ratio of about 1 or lower will be more uniform than a barrier formed in a via with a higher aspect ratio. Typically, a 300 Å layer of titanium followed by a 600 Å layer of titanium nitride forms the first barrier 54.

Contact plugs 56, 58 fill vias 52, 53. The contact plugs can be tungsten, aluminum, or any other conductor or combination thereof used for forming contact plugs. Tungsten is preferred for vias with an aspect ratio of about 1, however, aluminum can be used for vias with a lower aspect ratio, typically 0.8 or below.

A second dielectric structure 60 overlies the first dielectric structure 45. The second dielectric structure 60 is preferably a conformal undoped oxide, but can be any other oxide known in the art. The thickness of the second dielectric structure 60 is based on the aspect ratios of the vias 64, 66 through the second dielectric structure 60. The aspect ratio of the vias 64, 66 should be approximately at or below a threshold aspect ratio, based on the ease of etching vias having straight sidewalls that have good step coverage, without reducing the thickness of the entire interlevel dielectric structure. As described above, vias 64, 66 with an aspect ratio of about 1 or below can be etched having straight sidewalls. These vias 64, 66 will be easier to fill by the metal that is to form the contact plugs 70, 72, and will produce contact plugs of relatively uniform thickness. For example, for conductive elements 0.65 μ thick, and a threshold via aspect ratio of 1, the thickness of the second dielectric structure is preferably about, or below, 7000 Å.

A thin second barrier 67 overlies the sidewalls of the vias 64, 66, the portions of conductive elements 40, 42 exposed by vias 64, 66, and the portions of the second dielectric structure 60 under the enclosures 74, 76. The second barrier 67 is preferably titanium, titanium nitride, titanium tungsten, or a combination thereof. The first barrier layer is usually the minimum thickness needed to achieve a uniform barrier 67 in the vias 64, 66.

Contact plugs 70, 72 fill vias 64, 66, and enclosures 74, 76 overly the contact plugs 70, 72. The contact plugs 70, 72 and enclosures 74, 76 can be tungsten, aluminum, or any other conductor or combination thereof used for forming contact plugs. Tungsten is preferred for vias with an aspect ratio of about 1, however aluminum can be used for vias with a lower aspect ratio, typically 0.8 or below.

Figure 5:
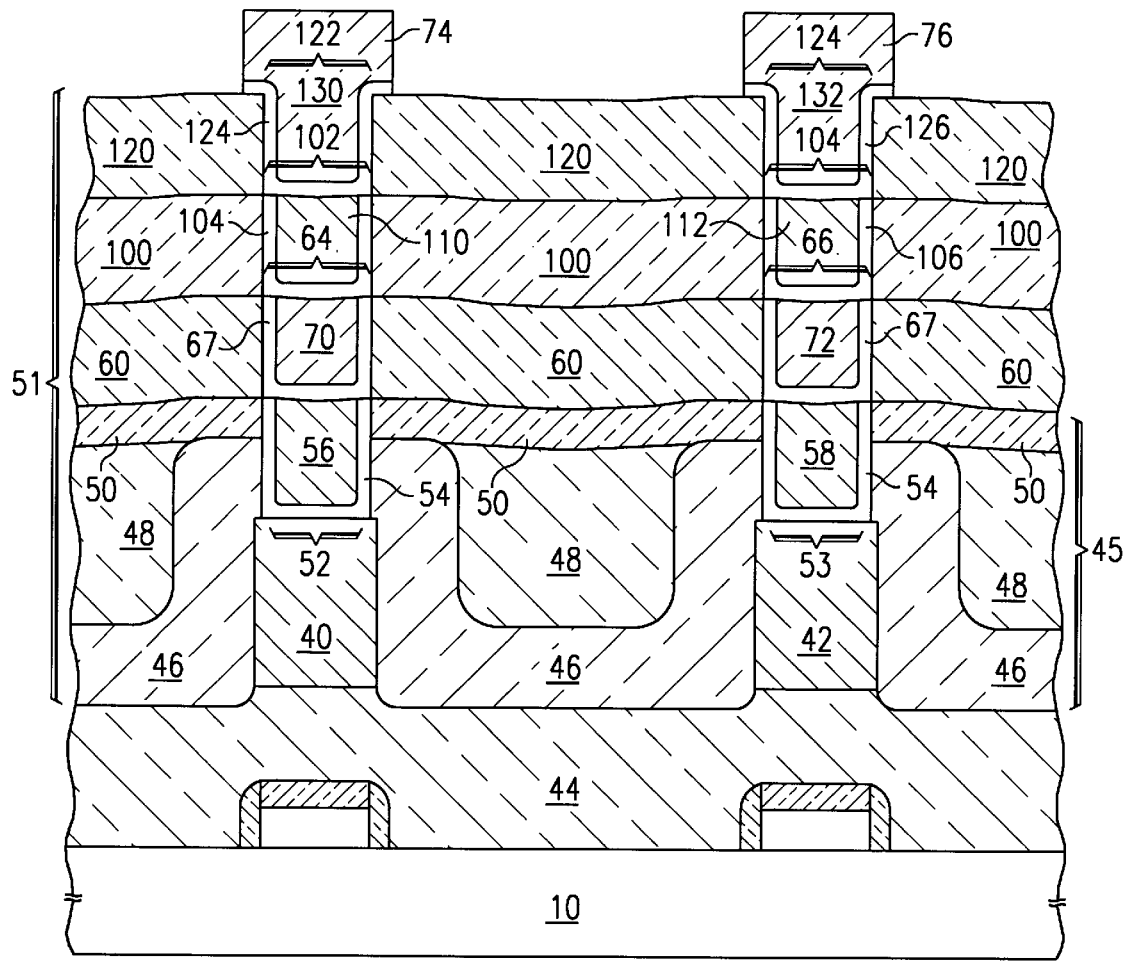
FIG. 5 is cross-sectional view of an alternative preferred embodiment of the integrated circuit formed according to the present invention.

As shown in FIG. 5, additional dielectric structures 100, 120 containing vias 102, 104, 122, 124 and contact plugs 110, 112, 130, 132 can overly the second dielectric structure 60. Such additional dielectric structures are identical to the second dielectric structure 60. The additional dielectric structures allow for a thicker overall dielectric structure 51 without increasing the aspect ratios of vias formed in each individual dielectric structure. The additional dielectric structures can also allow for the reduction in the thickness of each individual dielectric structure, and therefore the reduction of the aspect ratios of the vias through them, without reducing the thickness of the overall dielectric structure 51. However, each additional dielectric structure requires several additional process steps, and thus increases the cost of the integrated circuit containing it. Therefore, the advantages of increasing the number of dielectric structures should be balanced with the increased cost of producing the integrated circuit to achieve the optimum number of dielectric structures for a particular integrated circuit.

As described above, the present invention provides vias through thick dielectric structures, which have lower aspect ratios than etched vias through the entire interlevel dielectric structure 51. The lower aspect ratios allow the vias 52, 53, 64, 66 to have straight sidewalls, so the tops of the vias will be the same size as the bottoms, reducing the enclosure sensitivity of the enclosures 70, 72, and eliminating the problem of gaps produced at the tops of the vias during the etchback of the metal that forms the contact plugs due to large width of the metal at the top of the vias. Additionally, the straight sidewalls and lower aspect ratios of the vias 52, 53, 64, 66 allow for better step coverage by the metal; i.e. the metal in each of the vias fills an entire via without forming the voids at the bottom of vias that cause an open circuit. Furthermore, the tops of the vias are smaller than that of vias having higher aspect ratios, reducing the possibility of cracks in the metal due to the metal thickness.

Figure 4A:
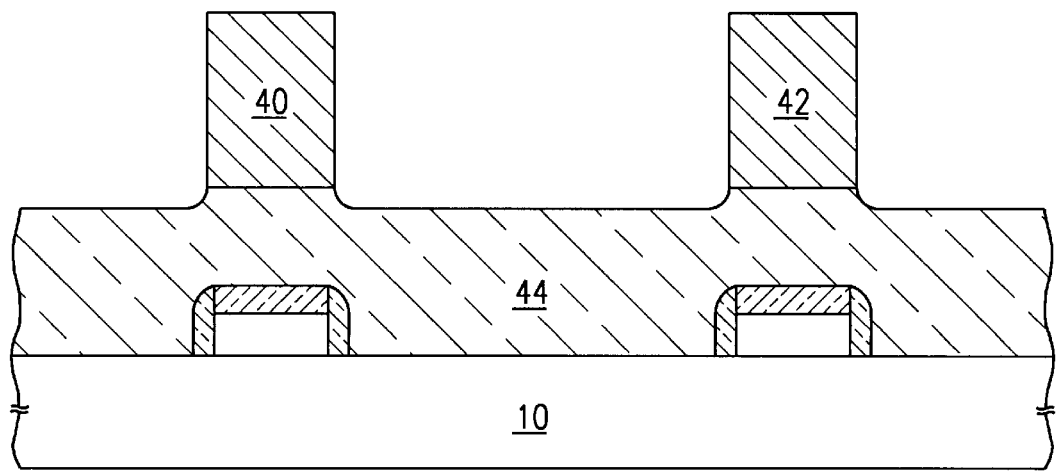
FIGS. 4a through 4m are cross-sectional views illustrating various steps in the fabrication of the integrated circuit in FIG. 2.

A method will now be described by which the above integrated circuit can be fabricated according to the preferred embodiment of the invention. Referring to FIG. 4a, an insulation layer 44 is formed over substrate 10, and transistors formed thereon, the detail which are not important to the present invention. Insulation layer 44 can be borophospho silicate glass (BPSG), phosphorous silicate glass (PSG), or a doped or undoped silicon oxide. Conductors 40, 42 are formed over the insulation layer 44 by deposition, patterning and etching. Contacts from conductors 40 and 42 to the transistors may also be formed. In modern processes, the thickness of the conductive elements is between 0.65 μm and 1.2 μm. The conductive elements can be aluminum, tungsten, or any other conductor or combination thereof used for forming conductive elements.

Figure 4B:
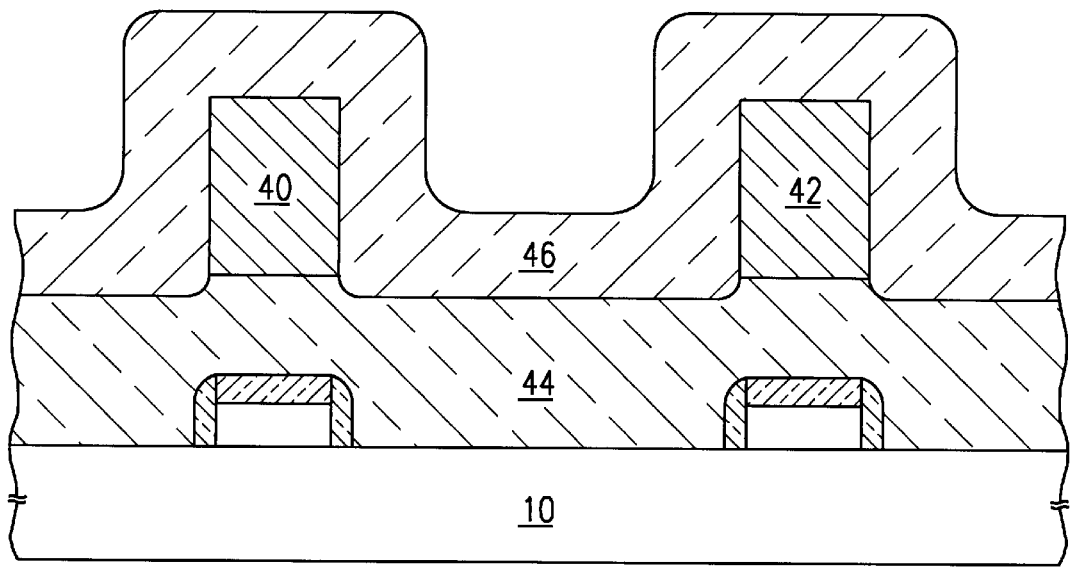

A first dielectric structure 45 is formed over the conductive elements 40, 42 and the insulation layer 44. Referring now to FIG. 4b, the formation of the first dielectric structure according to the preferred embodiment of the invention will be described. A first dielectric 46 of conformal undoped oxide, or any other oxide known in the art, is deposited by pressure vapor deposition (PVD), or any other conventional low temperature deposition method, over the conductive elements 40 and 42 and the substrate 10. In modern processes, the first dielectric 46 is typically deposited about 5000 Å thick.

Figure 4C:
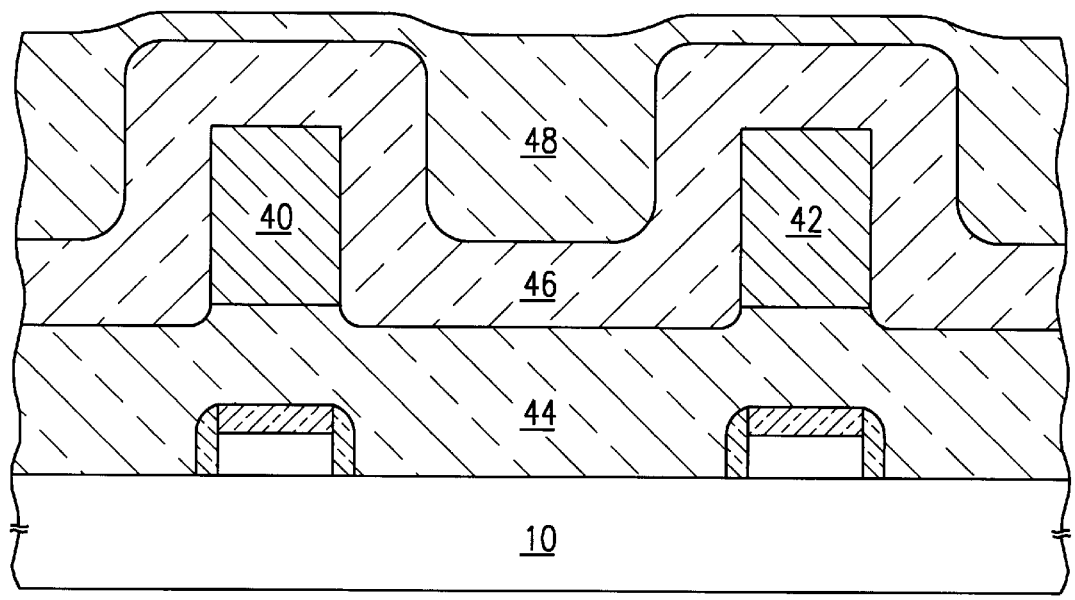
Figure 4D:
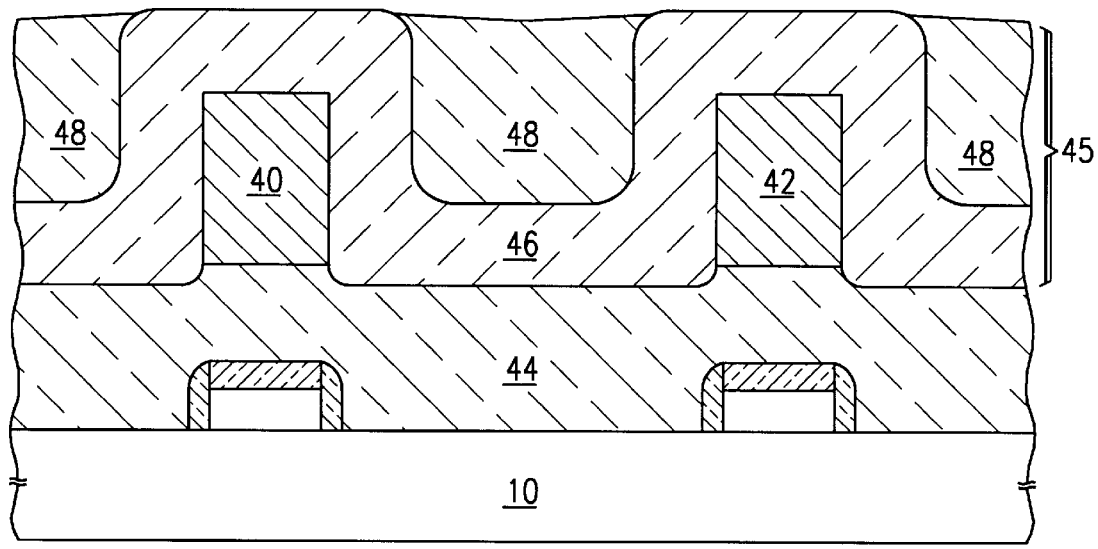

As shown in FIG. 4c, a layer of planarizing dielectric 48, typically spin-on-glass (SOG), is deposited over the first dielectric 46 to bulk fill the areas between the conductive elements and achieve better planarization. The planarizing dielectric 48 is etched back, as illustrated in FIG. 4d, to leave planarizing dielectric 48 in areas between the conductive elements, but to remove it from above the first dielectric 46 that overlies the conductive elements 40, 42.

Figure 4E:
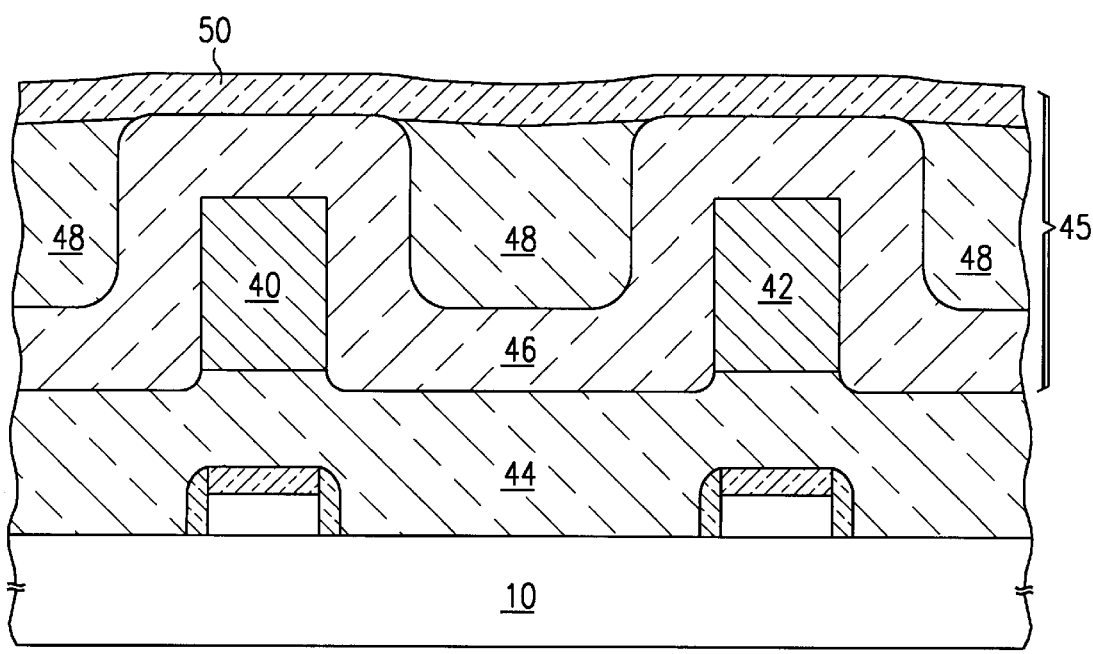

Referring to FIG. 4e, a second dielectric 50 is deposited by PVD, or any other conventional low temperature deposition method, over the first dielectric 46 and the planarizing dielectric 48. Like the first dielectric 46, the second dielectric 50 is preferably conformal undoped oxide, or any other oxide known in the art. The second dielectric 50 is deposited in a thinner layer than the first dielectric 46.

As discussed above, the second dielectric 50 is not necessary in all applications. As shown in FIG. 3, the first dielectric structure 45 can be formed by depositing the first dielectric layer 46 over the conductive elements 40, 42 and the insulator layer 44, in the same manner as described above, and forming the planarizing dielectric 48 over the first dielectric 46, also in the same manner as described above. The second dielectric 50 produces a thicker first dielectric structure 45, and therefore a thicker overall interlevel dielectric structure 51. However, the aspect ratios of vias 52, 53 in the first dielectric structure of is lower in first dielectric structures without the second dielectric 50.

The thickness of the first dielectric structure 45 is based on the aspect ratios of the vias to be formed through the first dielectric structure. The aspect ratios of the vias should be approximately at or below a selected threshold. This threshold is based on the ease of etching vias having straight sidewalls, the ease of filling the vias while retaining good step coverage, and the goal of increasing the thickness of the entire interlevel dielectric structure 51. In modern process technology, vias with aspect ratios of about 1 or below can be etched having straight sidewalls, so the top of a via will be the same size as the bottom of that via, reducing the enclosure sensitivity of the next conductor layer, and eliminating the problem of gaps at the top of the bias produced during the etchback of the metal caused by the large width of the metal at the tops of the vias. Additionally, the straight sidewalls and the lower aspect ratio allows for better step coverage by the conductor; i.e. the metal filling the vias will be able to fill the vias without forming voids at the bottoms of the vias, which can result in shorts. Furthermore, the tops of the vias are smaller than that of vias having higher aspect ratios, reducing the possibility of cracks in the metal due to the metal thickness.

The aspect ratio of the vias is the ratio of the thickness of the first dielectric structure to the width of the via. The thickness of the first dielectric structure 45 over the conductive elements 40, 42 when it contains both the first 46 and the second 50 dielectrics is the combined thickness of the first 46 and second 50 dielectrics, and just the thickness of the first dielectric 46 when the first dielectric structure 45 does not contain the second dielectric. For example, for conductive elements 0.65 Å thick, and a threshold via aspect ratio of 1, the thickness of the first dielectric structure 45 over the conductive elements 40, 42 is preferably about, or below, 7000 Å.

Figure 4F:
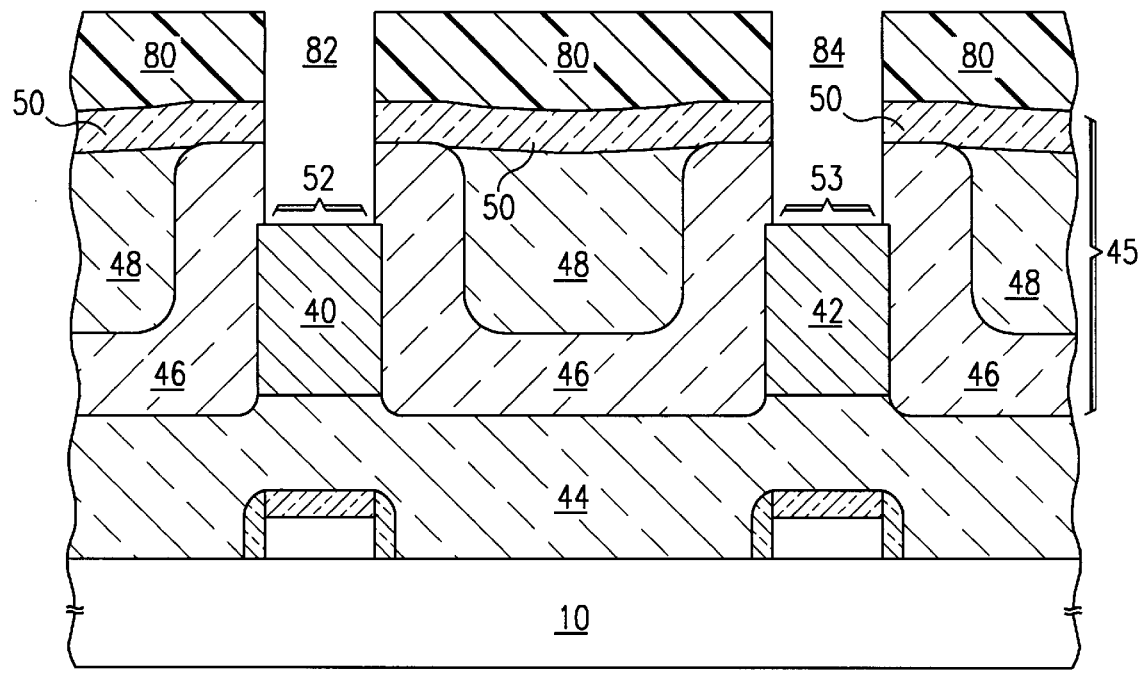

Vias 52, 53 are formed in the first dielectric structure 45. As illustrated in FIG. 4*f*, a first masking layer 80 is deposited on the surface of the first dielectric structure 45 using techniques known in the art. The first masking layer is typically a photoresist mask. Openings 82, 84 are made in masking layer 80, which define the locations of the vias 52, 53 to be formed. Vias 52 53 are formed, typically by an anisotropic etch, through the first dielectric structure 45 to expose portions of the conductive elements 40, 42.

Figure 4G:
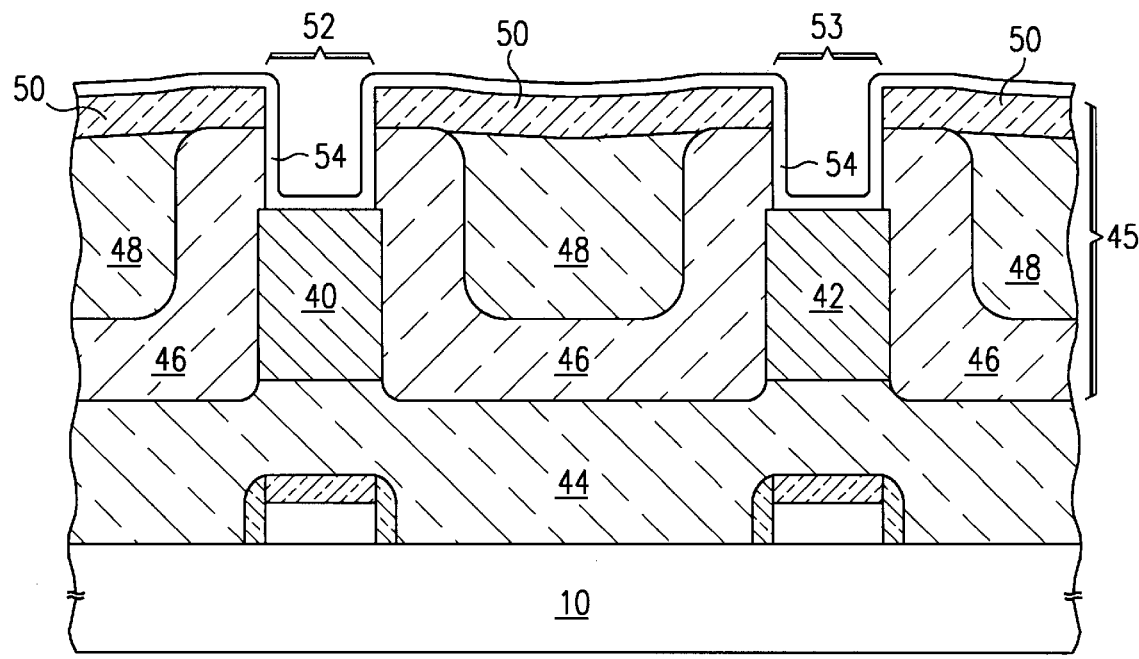

Referring to FIG. 4*g*, the masking layer 80 is removed and a thin first barrier 54 is deposited over the first dielectric structure 45, the conductive elements 40, 42, and the sidewalls of the vias 52, 53. The first barrier 54 is preferably titanium, titanium nitride, titanium tungsten, or a combination thereof. The first barrier 54 is deposited thick enough to achieve a uniform barrier in the vias. However, since the resistivity of the barrier is usually high, preferably the minimum thickness required to achieve a uniform barrier is deposited. In modern process technology, a barrier deposited in a via having an aspect ratio of about 1 or lower, like in the present invention, will be more uniform than a barrier formed in a via with a higher aspect ratio. Typically, a 300 Å layer of titanium followed by a 600 Å layer of titanium nitride is deposited to form the first barrier 54.

Figure 4H:
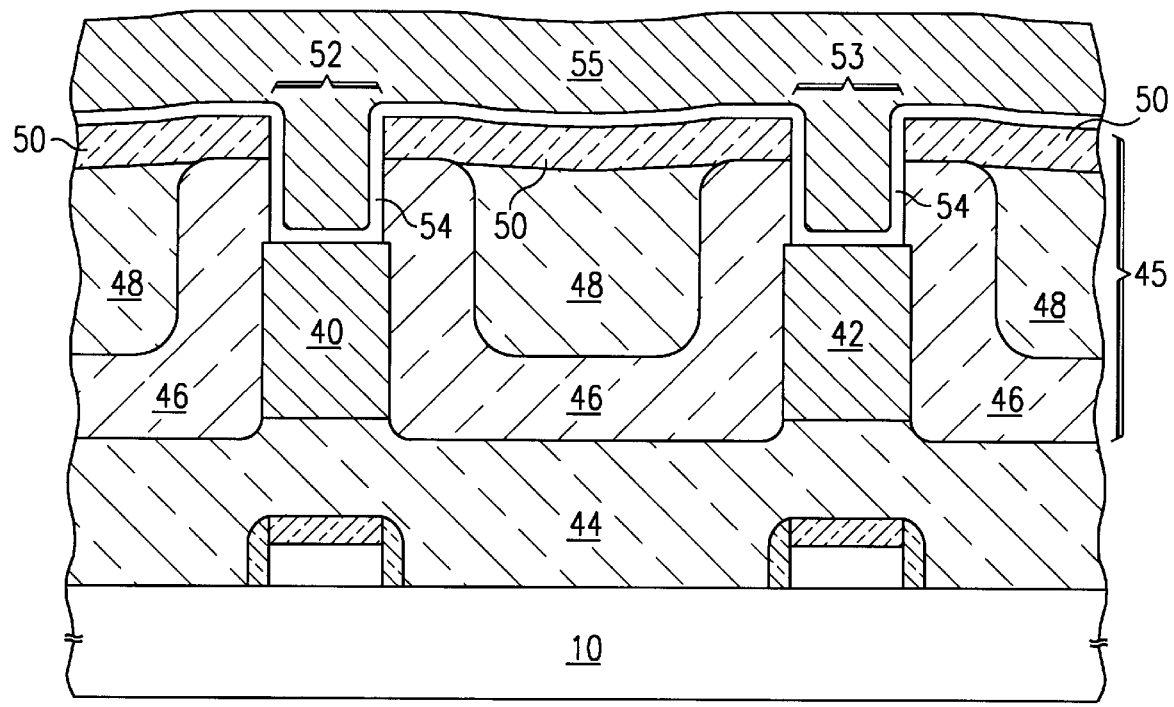

FIG. 4*h* shows the integrated circuit after a layer of first metal 55 is deposited over the first barrier 54. The layer of first metal 55 is deposited thick enough to fill the vias 52, 53, typically approximately 7000 Å. The layer of metal can be tungsten, aluminum, or any other conductor or combination thereof used for forming contact plugs. Tungsten is preferred for vias with an aspect ratio of about 1, however, aluminum can be used for vias with a lower aspect ratios, typically 0.8 or below.

Figure 4I:
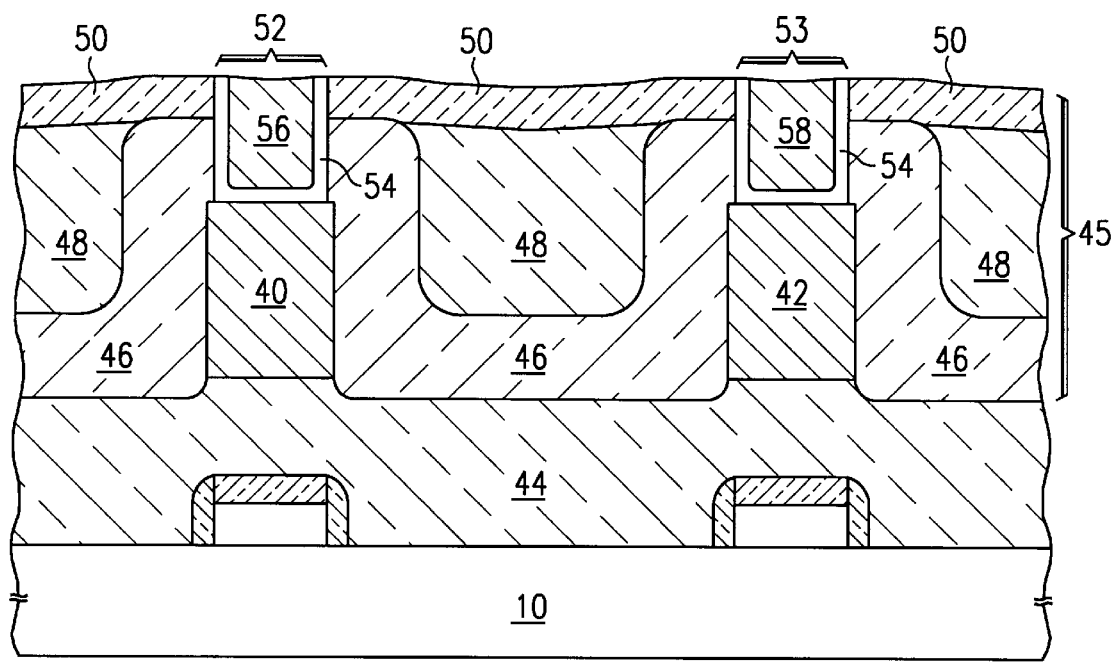

As illustrated is FIG. 4*i*, the layer of first metal 55 is etched back, using any etchback technique known in the art, to remove the layer of first metal from above the first barrier layer overlying the first dielectric structure 45, but leave metal in the vias 52, 53, forming contact plugs 56, 58. The first barrier 54 is then etched back from above the first dielectric structure 45, using a low pressure metal etch, or any other etch known in the art that can ensure that the entire barrier 54 is removed from above the first dielectric structure 45. Any portion of the barrier 54 left between dielectric layers can cause shorts the integrated circuit.

Figure 4J:
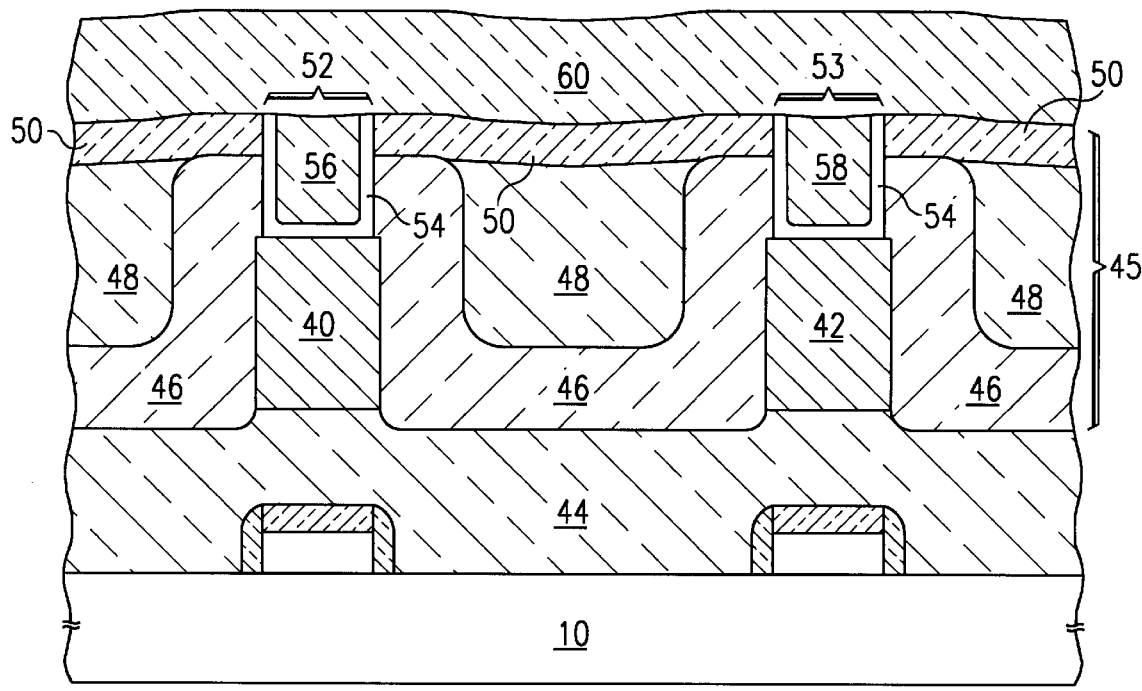

A second dielectric structure 60 is formed over the first dielectric structure 45 and the contact plugs 56, 58. Referring now to FIG. 4*j*, the formation of the second dielectric structure 60 according to the preferred embodiment of the invention will be described. A dielectric is deposited by PVD, or any other conventional low temperature deposition method, over the first dielectric structure 45 and the contact plugs 56, 58. The dielectric is preferably a conformal undoped oxide, or any other oxide known in the art.

The thickness of the second dielectric structure 60 is based on the aspect ratios of the vias to be formed through the second dielectric structure. The aspect ratios of the vias should be approximately at or below a threshold aspect ratio. This threshold is based on the ease of etching vias having straight sidewalls, the ease of filling these vias while retaining good step coverage, and the goal of increasing the thickness of the entire interlevel dielectric structure 51. As described above, vias with aspect ratios of about 1 or below can be etched having straight sidewalls, and will be easier to fill by the metal that is to form the contact plugs. This will reduce the enclosure sensitivity of the next conductor layer, eliminate gaps produced at the tops of the vias during the etchback of the metal, allow for better step coverage by the conductor, and reduce the possibility of cracks in the metal. The aspect ratios of the vias are the ratios of the thickness of the second dielectric structure, i.e the dielectric 62, to the widths of the vias. For example, for conductive elements 0.65 $\mu$m thick, and a threshold via aspect ratio of 1, the thickness of the first dielectric structure 45 is preferably about, or below, 7000 Å.

Figure 4K:
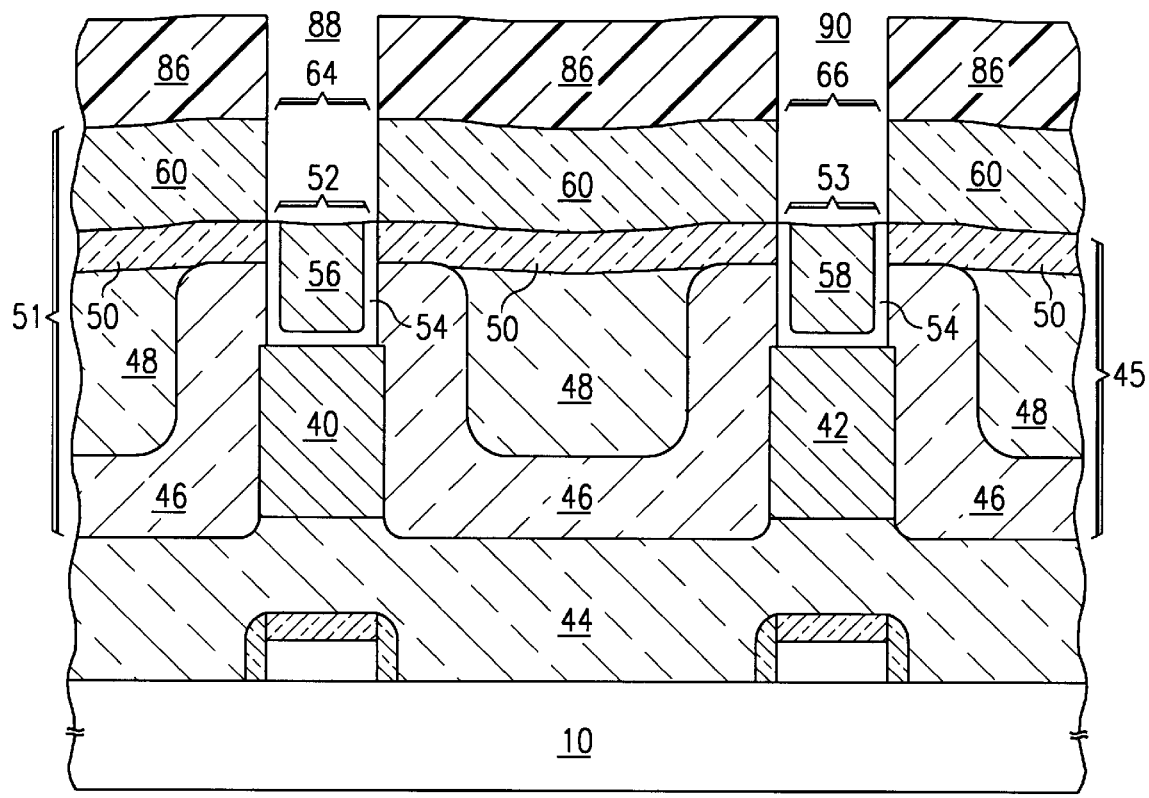

Vias 64, 66 are patterned through the second dielectric structure 60 to the underlying contact plugs 56, 58 as shown in FIG. 4*k*. A second masking layer 86, typically a photoresist mask, is deposited and patterned on the surface of the second dielectric 60 using techniques known in the art, to define openings 88, 90 at which the locations of the vias 64, 66 are to be formed. Vias 64, 66 are formed, typically by an anisotropic etch, through the second dielectric structure 60 to expose the portions of the contact plugs 56, 58.

Figure 4L:
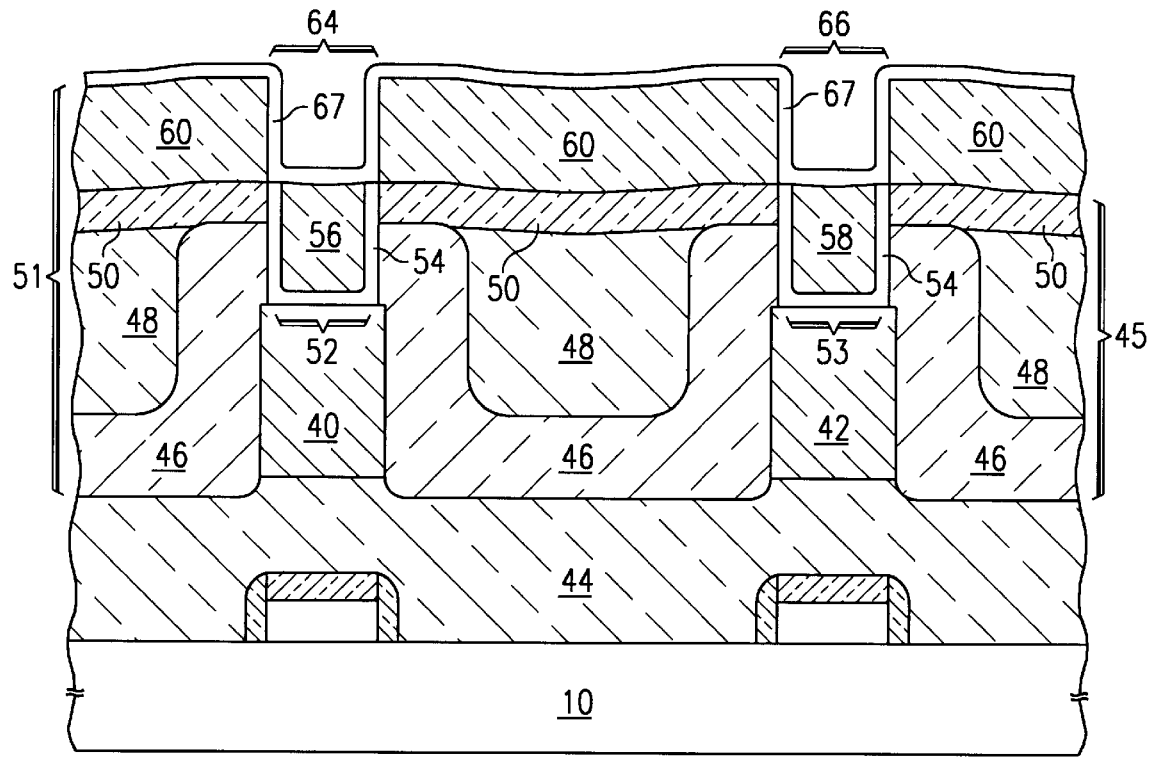

Referring to FIG. 4*l*, the second masking layer 86 is removed and a thin second barrier 67 is deposited over the second dielectric structure 60, contact plugs 56, 58, and the sidewalls of the vias 64, 66. The second barrier 67 is preferably titanium, titanium nitride, titanium tungsten, or a combination thereof. Like the first barrier 54, second barrier 67 is deposited thick enough to achieve a uniform barrier in the via. However, since the resistivity of the barrier is usually high, the minimum thickness required to achieve a uniform barrier is usually deposited. In modern process technology, a barrier deposited in a via having an aspect ratio of about 1 or lower, like in the present invention, will be more uniform than a barrier formed in a via with a higher aspect ratio.

Figure 4M:
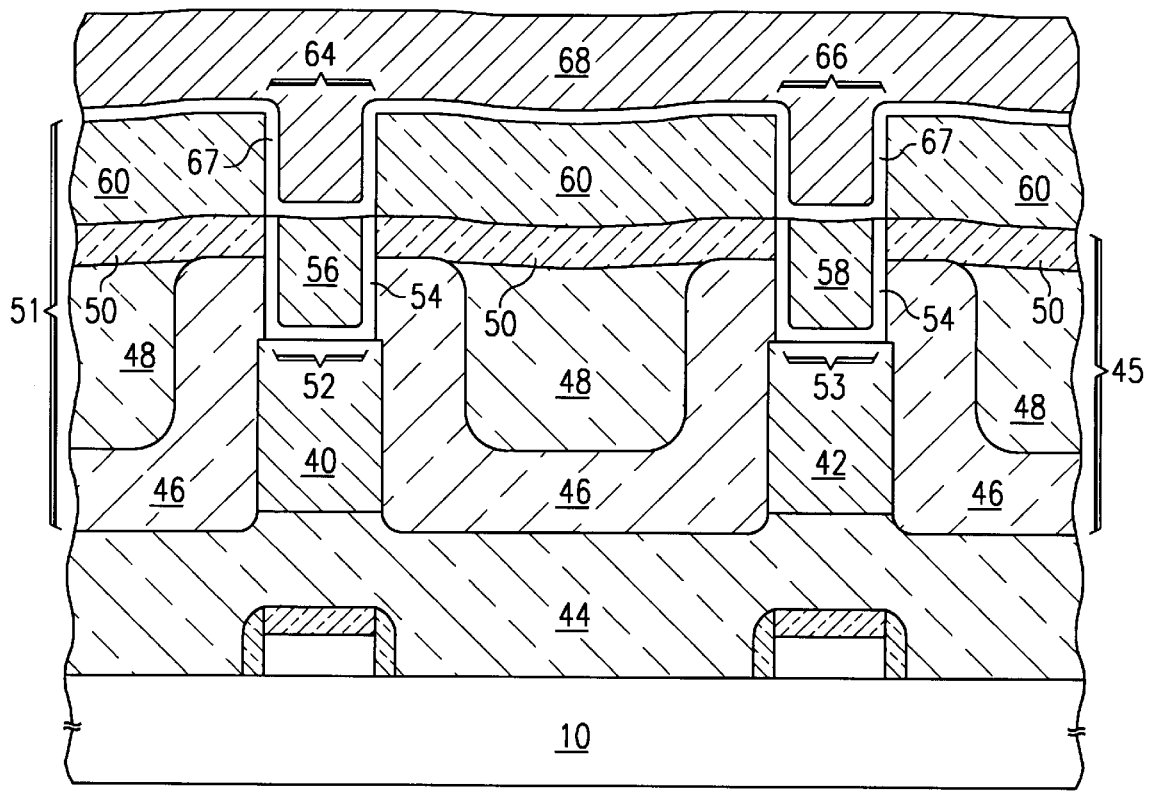

Second metal 68 is deposited over the second barrier 67, as illustrated in FIG. 4*m*. The second metal 68 is deposited thick enough to fill the vias 64, 66, typically about 7000 Å. The metal can be tungsten, aluminum, or any other conductor or combination thereof used for forming contact plugs. Tungsten is preferred for vias with an aspect ration of about 1, however, aluminum can be used for vias with a lower aspect ratio, typically 0.8 or below.

As illustrated in FIG. 2, the second metal is etched back, using any etchback known int art, to remove the first metal from above the second barrier 67 overlying the second dielectric structure 60, but leave metal in the vias 64, 66, forming contact plugs 70, 72, and enclosures 74, 76. The second barrier 67 is then etched back from above the second dielectric structure 60 to leave the second barrier only over the sidewalls of the vias 64, 66, the portions of conductive elements 40, 42 exposed by vias 64, 66, and the portions of the second dielectric structure 60 under the enclosures 74, 76. A low pressure metal etch, or any other etch known in the art that can ensure that the entire second barrier 67 is removed from above the second dielectric structure can be used to etch the second barrier 67. Any portion of the second barrier 67 left between dielectric layers can cause shorts in the integrated circuit.

As shown in FIG. 5, additional dielectric structures 100, 120 containing vias 102, 104, 122, 124 and contact plugs 110, 112, 130, 132 can be formed over the second dielectric structure 60. Such additional dielectric structure are formed in the same way as the second dielectric structure. The forming additional dielectric structures allows for a thicker overall interlevel dielectric structure 51 without increasing the aspect ratios of vias formed in each individual dielectric structure. The additional dielectric structures can also allow for the reduction thickness of each individual dielectric structure, and therefore the reduction of the aspect ratios of the vias formed in them, without reducing the thickness of the overall dielectric structure 51. However, each additional dielectric structure requires several additional process steps, increasing the cost of the integrated circuit containing it. Therefore the advantages of increasing the number of dielectric structures should be balanced with the increased cost of producing the integrated circuit to achieve the optimum number of dielectric structures for a particular integrated circuit.

As described above, the present invention provides a method of forming vias through thick dielectric structures, which have lower aspect ratios than vias formed through the entire interlevel dielectric structure 51. The lower aspect ratios allow the vias 52, 53, 64, 66 to have straight sidewalls, so the tops of a vias will be the same size as the bottoms of the vias, reducing the enclosure sensitivity of the enclosures 70, 72, and eliminating the problem of gaps produced at the tops of the vias during the etchback of the metal forming the contact plugs due to the large width of the metal at the top of the vias. Additionally, the straight sidewalls and lower aspect ratio of the vias 52, 53, 64, 66 allow for better step coverage by the metal; i.e. the metal filling each of the vias will be able to fill an entire via without forming voids at the bottom of via, which can result in an open circuit. Furthermore, the tops of the vias formed according to the present invention are smaller than those of vias having higher aspect ratios, reducing the possibility of cracks in the metal due to the metal thickness. Additionally, the present invention can be used in conventional process flow, without significantly complicating the fabrication process.

While the invention has been specifically described with reference to a preferred embodiment, it will be understood by those of ordinary skill in the prior art having reference to the current specification and drawings that various modifications may be made and various alternatives are possible therein without departing from the spirit and scope of the invention.

I claim:

1. A semiconductor device comprising:
   a conductive element;
   a first dielectric structure overlying said conductive element, having an upper surface and a first level via therethrough to expose a portion of said conductive element:
   a first level contact plug extending into said first level via to make electrical contact with the exposed portion of said conductive element, said first level contact plug having an upper surface substantially planar with said upper surface of said first dielectric structure;
   a second dielectric structure overlying said first dielectric structure and said first level contact plug, having a second level via therethrough to expose a portion of said first level contact plug: and
   a second level contact plug extending into said second level via to make electrical contact with said exposed portion of said first level contact plug;
   wherein said first dielectric structure comprises: a first dielectric overlying said conductive element; a planarizing dielectric layer overlying said first dielectric; and a second dielectric overlying said planarizing dielectric and said first dielectric.

2. A device according to claim 1, wherein the aspect ratio of said first level via is below a first threshold.

3. A device according to claim 1, wherein the aspect ratio of said second level via is below a second threshold.

4. A device according to claim 1, further comprising:
   a first barrier overlying sidewalls of said first level via and overlying said exposed portion of said conductive element; and
   a second barrier overlying sidewalls of said second level via and overlying said exposed portion of said first level contact plug.

5. A device according to claim 4, wherein said first and second barriers comprise titanium.

6. A device according to claim 1, further comprising an insulation layer positioned under said conductive element and said first dielectric structure.

7. A device according to claim 6, wherein insulation layer comprises an oxide.

8. A device according to claim 1, wherein each said first level and second level contact plugs comprise tungsten.

9. A semiconductor device comprising:
   a conductive element;
   a first dielectric structure overlying said conductive element, having a first level via therethrough to expose a portion of said conductive element ,said first dielectric structure having: a first dielectric overlying said conductive element; a planarizing dielectric layer overlying said first dielectric; and a second dielectric overlying said planarizing dielectric and said first dielectric;
   a first level contact plug extending into said first level via to make electrical contact with the exposed portion of said conductive element;
   a second dielectric structure overlying said first dielectric structure and said first level contact plug, having a second level via therethrough to expose a portion of said first level contact plug;
   a second level contact plug extending into said second level via to make electrical contact with said exposed portion of said first level contact plug;
   a third dielectric structure overlying said second dielectric structure and said second level contact plug, wherein a third level via through said third dielectric structure exposes a portion of said second level contact plug; and
   a third level contact plug extending into said third level via to make electrical contact with said exposed portion of said second level contact plug.

10. A semiconductor device, comprising:
   an insulation layer overlying a semiconducting surface of a body;
   a conductive element overlying said insulation layer;
   a first dielectric structure overlying said conductive element and said insulation layer, having a first level via therethrough to expose a portion of said conductive element;
   a first level contact plug extending into said first level via to make electrical contact with the exposed portion of said conductive element;
   a second dielectric structure overlying said first dielectric structure and said first level contact plug, having a second level via therethrough to expose a portion of said first level contact plug; and a second level contact plug extending into said second level via to make electrical contact with said exposed portion of said first level contact plug, wherein said first dielectric structure comprises: a first dielectric overlying said conductive element and said insulating layer; and a planarizing dielectric layer overlying said first dielectric.

11. A semiconductor device according to claim 10, wherein said first dielectric structure further comprises a second dielectric overlying said planarizing dielectric and said first dielectric.

12. A semiconductor device according to claim 10, wherein the aspect ratio of said first level via is below a first threshold.

13. A semiconductor device according to claim 10, wherein the aspect ratio of said second level via is below a second threshold.

14. A semiconductor device according to claim 10, further comprising:
  a first barrier overlying sidewalls of said first level via and overlying said exposed portion of said conductive element; and
  a second barrier overlying sidewalls of said second level via and overlying said exposed portion of said first level contact plug.

15. A semiconductor device according to claim 10, wherein said insulation layer comprises an oxide.

16. A semiconductor device according to claim 10, wherein each said first level and second level contact plugs comprise tungsten.

17. A semiconductor device comprising:
  conductive element;
  a first dielectric structure overlying said conductive element, having a first level via therethrough to expose a portion of said conductive element;
  a first barrier overlying sidewalls of said first level via and overlying said exposed portion of said conductive element;
  a first level contact plug extending into said first level via to make electrical contact with the exposed portion of said conductive element;
  a second dielectric structure overlying said first dielectric structure and said first level contact plug, having a second level via therethrough to expose a portion of said first level contact plug;
  a second barrier making direct contact with said first level contact plug, wherein said second barrier overlies sidewalls of said second level via and overlies said exposed portion of said first level contact plug;
  a second level contact plug extending into said second level via to make electrical contact with said exposed portion of said first level contact plug, making direct contact with said second barrier;
  a third dielectric structure overlying said second dielectric structure and said second level contact plug, wherein a third level via through said third dielectric structure exposes a portion of said second level contact plug;
  a third barrier overlying sidewalls of said third level via and overlying said exposed portion of said second level contact plug; and
  a third level contact plug extending into said third level via to make electrical contact with said exposed portion of said second level contact plug;

wherein said first dielectric structure comprises: a first dielectric overlying said conductive element; a planarizing dielectric layer overlying said first dielectric; and a second dielectric overlying said planarizing dielectric and said first dielectric.

18. A semiconductor device, comprising:
  a conductive element;
  a first dielectric structure overlying said conductive element, having a first level via therethrough to expose a portion of said conductive element, said first level via having an aspect ratio at or below approximately 1; wherein said first dielectric structure includes a first dielectric overlying said conductive element and a planarizing dielectric layer overlying said first dielectric:
  a first barrier overlying sidewalls of said first level via and overlying said exposed portion of said conductive element;
  a first level contact plug extending into said first level via to make electrical contact with the exposed portion of said conductive element;
  a second dielectric structure overlying said first dielectric structure and said first level contact plug, having a second level via therethrough to expose a portion of said first level contact plug, said second level via having an aspect ratio at or below approximately 1;
  a second barrier making contact with said first level contact plug, wherein said second barrier overlies sidewalls of said second level via and overlies said exposed portion of said first level contact plug; and
  a second level contact plug extending into said second level via to make electrical contact with said exposed portion of said first level contact plug;

wherein said first dielectric structure further comprises a second dielectric overlying said planarizing dielectric and said first dielectric.

19. A semiconductor device according to claim 18, wherein each said first level and second level contact plugs comprise tungsten.

20. A semiconductor device according to claim 18, further comprising:
  a third dielectric structure overlying said second dielectric structure and said second level contact plug, wherein a third level via through said third dielectric structure exposes a portion of said second level contact plug; and
  a third level contact plug extending into said third level via to make electrical contact with said exposed portion of said second level contact plug.

21. A semiconductor device according to claim 18, wherein said first and second barriers comprise titanium.

22. A semiconductor device according to claim 18, further comprising an insulation layer, overlying a semiconducting surface of a body positioned under said conductive element and said first dielectric structure.

* * * * *